(12) United States Patent
Shizuno

(10) Patent No.: US 8,742,323 B2
(45) Date of Patent: Jun. 3, 2014

(54) SEMICONDUCTOR MODULE

(75) Inventor: Yoshinori Shizuno, Kanagawa (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 214 days.

(21) Appl. No.: 12/591,066

(22) Filed: Nov. 6, 2009

(65) Prior Publication Data

US 2010/0117175 A1 May 13, 2010

(30) Foreign Application Priority Data

Nov. 7, 2008 (JP) .................................. 2008-286500

(51) Int. Cl.
*H01J 40/14* (2006.01)

(52) U.S. Cl.
USPC .......... 250/239; 250/208.1; 250/216; 257/98; 257/432; 257/435; 438/55; 438/64; 438/106; 438/116; 438/125

(58) Field of Classification Search
USPC ......... 250/216, 239, 208.1; 257/435, 98, 432; 438/64, 55, 106, 116, 118, 119, 125
See application file for complete search history.

(56) References Cited

U.S. PATENT DOCUMENTS

| | | | | |
|---|---|---|---|---|
| 4,055,761 | A * | 10/1977 | Shimomura | 250/239 |
| 5,087,964 | A * | 2/1992 | Hatta | 257/680 |
| 6,870,238 | B2 * | 3/2005 | Exposito et al. | 257/431 |
| 7,378,645 | B2 * | 5/2008 | Mihara et al. | 250/239 |
| 7,423,334 | B2 * | 9/2008 | Tu et al. | 257/680 |
| 7,923,676 | B2 * | 4/2011 | Kinoshita | 250/208.1 |
| 8,013,350 | B2 * | 9/2011 | Itoi et al. | 257/98 |
| 2003/0094675 | A1 * | 5/2003 | Yamamoto et al. | 257/666 |
| 2006/0219885 | A1 * | 10/2006 | Kinoshita et al. | 250/239 |
| 2007/0018263 | A1 * | 1/2007 | Noma | 257/428 |
| 2007/0228403 | A1 * | 10/2007 | Choi et al. | 257/98 |
| 2008/0278617 | A1 * | 11/2008 | Tanida et al. | 348/340 |
| 2008/0303107 | A1 * | 12/2008 | Minamio et al. | 257/432 |
| 2010/0117176 | A1 * | 5/2010 | Uekawa | 257/432 |
| 2011/0304003 | A1 * | 12/2011 | Tanida et al. | 257/447 |

FOREIGN PATENT DOCUMENTS

| | | |
|---|---|---|
| JP | 3-178168 | 8/1991 |
| JP | 8-88339 | 4/1996 |
| JP | 10-84509 | 3/1998 |
| JP | 2001-351997 | 12/2001 |
| JP | 2002-512436 | 4/2002 |
| JP | 2002-261260 | 9/2002 |
| JP | 2004-226873 | 8/2004 |
| JP | 2004-229167 | 8/2004 |
| JP | 2004-363511 | 12/2004 |
| JP | 2007-129164 A | 5/2007 |
| JP | 2007-165696 | 6/2007 |
| JP | 2008-172191 | 7/2008 |
| JP | 2010-11230 | 1/2010 |

* cited by examiner

*Primary Examiner* — Georgia Y Epps
*Assistant Examiner* — Kevin Wyatt
(74) *Attorney, Agent, or Firm* — Rabin & Berdo, P.C.

(57) ABSTRACT

A semiconductor module including a semiconductor chip having a light receiving device formed at a front thereof and a light permeable cover having a front, a back, and a side. The light permeable cover is disposed opposite to the front of the semiconductor chip such that the front of the semiconductor chip is covered by the back of the light permeable cover. The light permeable cover is provided at the outer circumferential region of the front thereof and at the side thereof with a light shielding layer. It is possible to prevent the incidence of unnecessary light from the side of the light permeable cover of a CSP and to easily adjust the distance between a lens and the front of the semiconductor chip within tolerance.

18 Claims, 2 Drawing Sheets

V-V

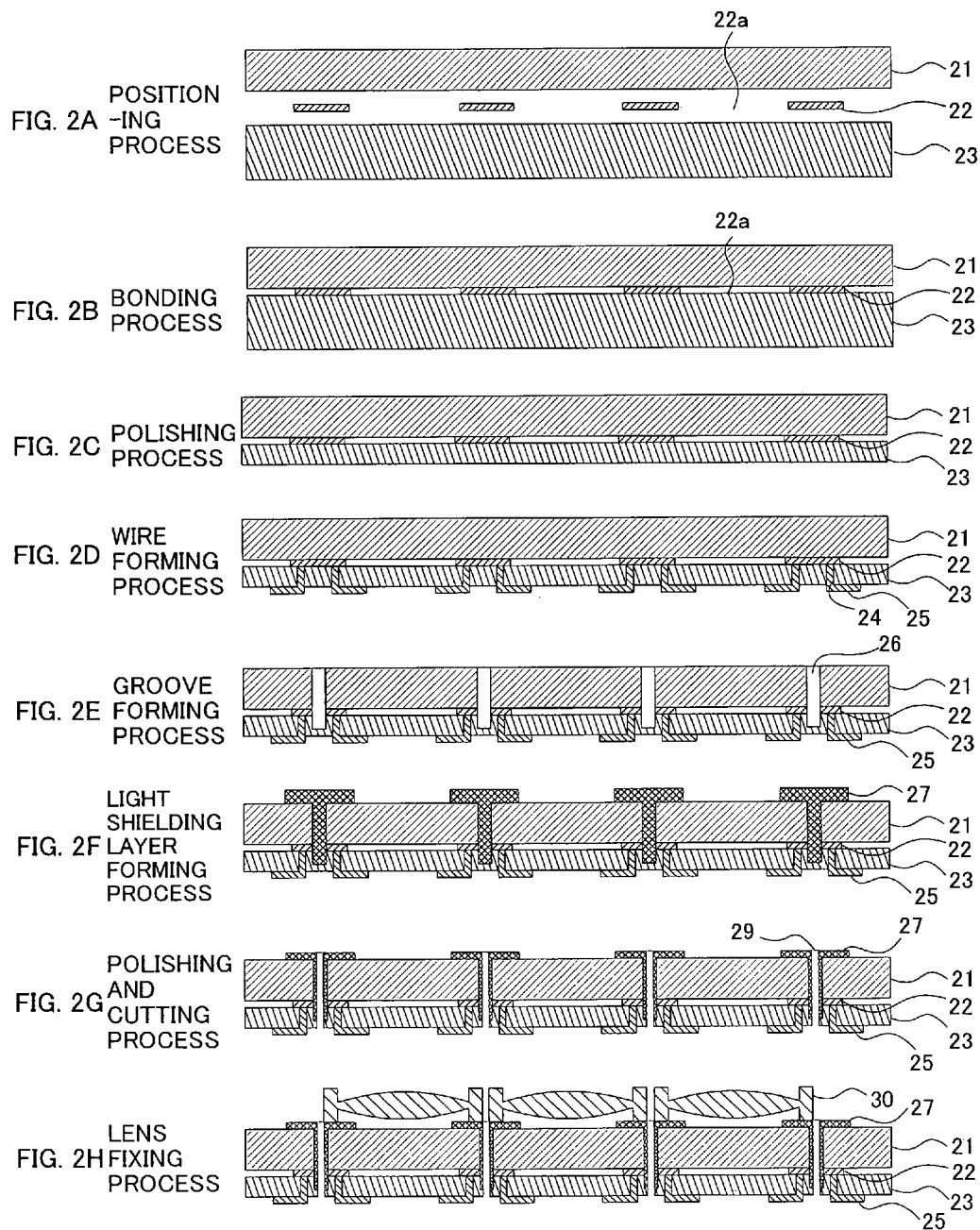

SEMICONDUCTOR MODULE

BACKGROUND OF THE INVENTION

1. Field of the Invention

The present invention relates to a semiconductor module, and, more particularly, to a wafer level type semiconductor module having a light permeable cover.

2. Description of the Related Art

A sensor device, which is represented by a CMOS image sensor, is used in a portable device, such as a mobile phone, to take an image. The sensor device for taking an image, constituted by a camera unit including a lens, an image processing chip, a semiconductor chip of a sensor main body, a substrate, and a housing, is assembled in the portable device.

According to high performance and slimness of the portable device, miniaturization of the camera unit is being strongly requested. For this reason, by camera unit manufacturers, downsizing of the sensor, integration of the lens with the semiconductor chip, and so on are performed.

The downsizing of the sensor is typically achieved by a chip size package (CSP). Japanese Patent Application Publication No. 2007-129164 discloses a semiconductor module for optical apparatuses using a wafer level chip size package (W-CSP), which is a kind of CSP. In this semiconductor module, a solid state imaging device, which is a semiconductor chip, is covered by a light permeable cover, an electrode pad disposed at an outer circumferential region of the solid state imaging device is electrically connected to an external connection terminal provided at the back of the solid state imaging device (the side opposite to the light permeable cover) via a re-wire in a through hole. A lens unit having a lens is fixed on the light permeable cover. Light, incident upon the lens, passes through the light permeable cover and reaches an effective pixel region (a light receiving device portion) of the solid state imaging device, where an electric signal created by a photoelectric conversion device is extracted from the external connection terminal provided at the back of the solid state imaging device.

In the conventional CSP structure disclosed in Japanese Patent Application Publication No. 2007-129164, however, light is unnecessarily introduced from the side of the light permeable cover, and the introduced light reaches the light receiving device. Therefore, it is not possible to achieve predetermined performance of the sensor. Also, in a semiconductor module constructed such that the lens unit is fixed to the light permeable cover as disclosed in Japanese Patent Application Publication No. 2007-129164, if a thickness error of the light permeable cover, or an adhesion thickness error between the lens unit and the light permeable cover, exists, the distance between the lens and the front of the semiconductor chip may not be appropriately adjusted, a focusing range may deviate from a desired level, or no focus is adjusted at all.

SUMMARY OF THE INVENTION

Therefore, the present invention has been made to solve the above problems, and it is a primary object of the present invention to provide a semiconductor module that is capable of preventing the incidence of unnecessary light from the side of a light permeable cover of a CSP and easily adjusting the distance between a lens and the front of a semiconductor chip within tolerance.

In an aspect of the present invention, a semiconductor module includes a semiconductor chip having a light receiving device formed at a front thereof and a light permeable cover having a front, a back, and a side, the light permeable cover being disposed opposite to the front of the semiconductor chip such that the front of the semiconductor chip is covered by the back of the light permeable cover, wherein the light permeable cover is provided on an outer circumferential region of the front thereof and on the side thereof with a light shielding layer.

In the semiconductor module according to the present invention, the colored light shielding layer is formed at the outer circumferential region of the front of the light permeable cover on the lens unit side and at the side of the light permeable cover, with the result that light is prevented from being introduced from the side of the light permeable cover. Consequently, it is possible to prevent sensor performance of the light receiving device of the semiconductor chip from being deteriorated due to unnecessary light. Also, since it is possible to easily set the distance between the front of the light shielding layer and the front of the semiconductor chip such that the distance is within a predetermined distance tolerance by adjusting the thickness of the light shielding layer on the outer circumferential region of the front of the light permeable cover on the lens unit side, it is possible to appropriately adjust the distance between the lens and the light receiving device for focusing simply by fixing the lens unit to the front of the light shielding layer. Furthermore, since the outer circumferential region of the light permeable cover is protected by the light shielding layer, it is possible to prevent a portion of the light permeable cover from being defective due to impact caused by handling during the manufacture of the semiconductor module.

In another aspect of the present invention, a semiconductor module comprises a semiconductor chip having a light receiving device formed at a front thereof, a light permeable cover having a first front, a first back, and a first side, the first back of the light permeable cover being opposite to the front of the semiconductor chip and disposed to cover the light receiving device, and a lens unit having a condensing part for supplying light to the light receiving device via the light permeable cover and a support part for supporting the condensing part, the lens unit being mounted on the light permeable cover while the support part and the first front of the light permeable cover are connected to each other, wherein the light permeable cover is provided on an outer circumferential region of the first front thereof and on the first side thereof with a light shielding layer to shield light from outside, and the support part and the light permeable cover are connected to each other via the light shielding layer formed on the outer circumferential region of the first front.

In another aspect of the present invention, a manufacturing method of a semiconductor module including a light permeable cover disposed opposite to a front of a semiconductor chip to cover the front of the semiconductor chip where a light receiving device is formed, comprises preparing a semiconductor device wafer having a plurality of semiconductor chip forming regions each comprising a region where the light receiving device is formed at a front thereof, bonding the front of the semiconductor device wafer and a light permeable wafer prepared to provide a plurality of the light permeable covers via an adhesion layer to form a semiconductor wafer, forming grooves around the respective semiconductor chip forming regions such that the grooves extend from a front of the light permeable wafer to an interior of the semiconductor device wafer, forming light shielding layers in the grooves and on opposite surrounding regions, adjacent to the grooves, of the front of the light permeable wafer, polishing fronts of the light shielding layers on the surrounding regions such that a distance between the front of the semiconductor device wafer and the fronts of the light shielding layers on the surrounding regions has a predetermined value, and cutting the semiconductor wafer into semiconductor modules at the light shielding layers in the grooves and at portions, connected to the light shielding layers, of the semiconductor device wafer.

In the manufacturing method of the semiconductor module according to the present invention, the grooves are formed around the respective semiconductor chip forming regions of the semiconductor device wafer such that the grooves extend from the front of the light permeable wafer to the interior of the semiconductor device wafer, and the light shielding layers are formed in the grooves and on the opposite surrounding regions, adjacent to the grooves, of the front of the light permeable wafer, with the result that light is prevented from being introduced from the side of the light permeable cover. Consequently, it is possible to prevent sensor performance of the light receiving device of the semiconductor chip from being deteriorated due to unnecessary light. Also, since the fronts of the light shielding layers are polished such that the distance between the light receiving devices provided at the front of the semiconductor device wafer and the fronts of the light shielding layers has a predetermined value, it is possible to set the distance between the fronts of the light shielding layers and the light receiving devices such that the distance is within a predetermined distance tolerance, and it is possible to appropriately adjust the distance between the lenses and the light receiving devices for focusing simply by fixing the lens units to the fronts of the light shielding layers. Furthermore, since the outer circumferential region of the light permeable cover is protected by the light shielding layer, it is possible to prevent a portion of the light permeable cover from being defective due to impact caused by handling during the manufacture of the semiconductor module.

The manufacturing method further comprises fixing lens units for condensing light on the light receiving devices via the light permeable covers to the fronts of the light shielding layers on the surrounding regions, such that the lens units correspond to the respective semiconductor chip forming regions, after the polishing.

In the manufacturing method, the grooves are formed by dicing.

In the manufacturing method, the light shielding layers are formed by vacuum printing.

In the manufacturing method, each of the light shielding layers is formed of any one of acryl, silicone, and polyimide.

In the manufacturing method, each of the light shielding layers is formed of epoxy.

In another aspect of the present invention, a manufacturing method of a semiconductor module, comprises preparing a semiconductor device wafer having a plurality of semiconductor device forming regions each comprising a region where the light receiving device is formed at a front thereof, preparing a light permeable wafer having a front and a back, preparing a plurality of lens units each comprising a condensing part and a support part for supporting the condensing part, arranging the semiconductor device wafer and the light permeable wafer such that the front of the semiconductor device wafer and the back of the light permeable wafer are opposite to each other and bonding the semiconductor device wafer and the light permeable wafer to each other via an adhesion layer to form a semiconductor wafer, forming grooves around the respective semiconductor chip forming regions such that the grooves extend from a front of the light permeable wafer to an interior of the semiconductor device wafer, forming light shielding layers in the grooves and on opposite surrounding regions, adjacent to the grooves, of the front of the light permeable wafer, polishing fronts of the light shielding layers on the surrounding regions such that a distance between the front of the semiconductor device wafer and the fronts of the light shielding layers on the surrounding regions has a predetermined value, bonding the supports and the light shielding layers formed on the front of the light permeable wafer and mounting the plurality of lens units at positions where light from the condensing parts is supplied to the respective light receiving devices via the light permeable wafer on the front of the light permeable wafer, and cutting the semiconductor wafer into pieces at the light shielding layers in the grooves and at portions, connected to the light shielding layers, of the semiconductor device wafer.

BRIEF DESCRIPTION OF THE DRAWINGS

FIGS. 2A to 2H are sectional views illustrating a manufacturing method of the semiconductor module of FIGS. 1A and 1B.

DETAILED DESCRIPTION OF THE INVENTION

Hereinafter, an embodiment of the present invention will be described in detail with reference to the accompanying drawings.

Figure 1A:
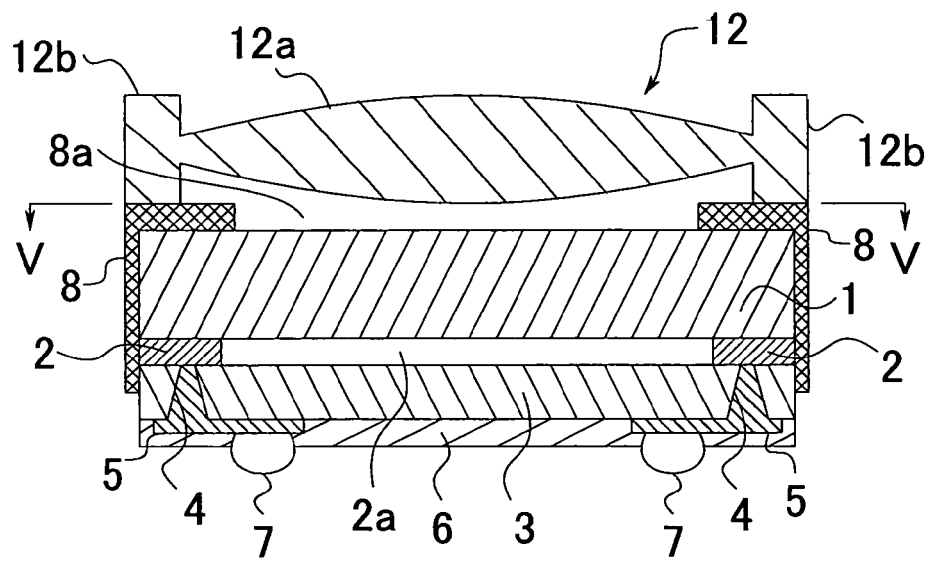
FIG. 1A is a sectional view illustrating a semiconductor module according to the present invention.
Figure 1B:
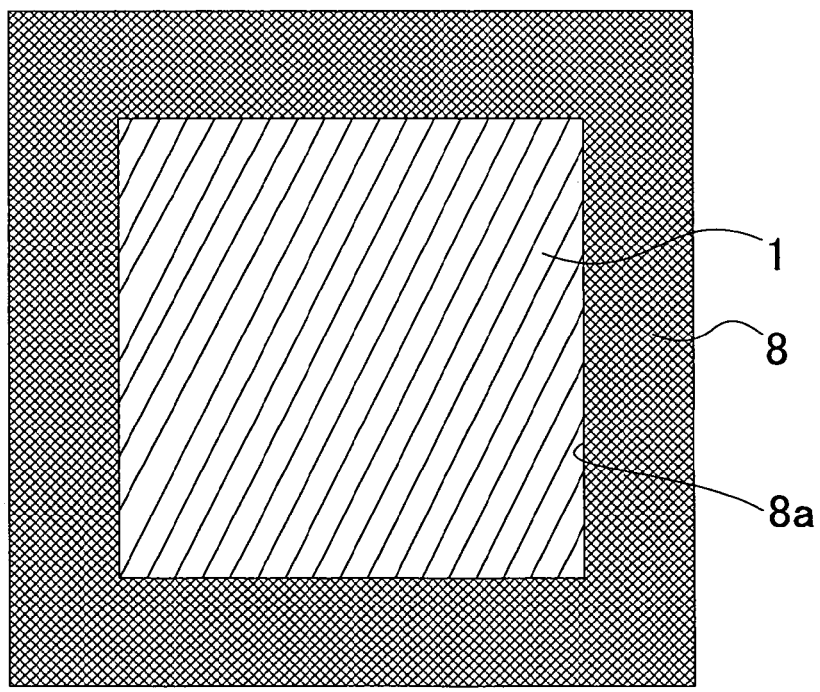
FIG. 1B is a plan view illustrating the semiconductor module according to the present invention.

FIG. 1A illustrates a section of a W-CSP type semiconductor module according to an embodiment, and FIG. 1B illustrates the top of the semiconductor module of FIG. 1A excluding a lens unit, i.e., a portion taken along line V-V of FIG. 1A.

This semiconductor module is constructed such that a semiconductor chip 3, such as a CMOS image sensor, is covered by a cover glass 1 via an annular encapsulation material 2 (an adhesion layer) having a quadrangular opening 2a formed at the central portion thereof. The cover glass 1 has a quadrangular front, a quadrangular back, and a side of a predetermined thickness between the front and the back.

The semiconductor chip 3 is provided, for example, at the center of the front thereof (that is, the surface facing the cover glass 1) with a semiconductor main body, i.e., a light receiving device (not shown). Also, a plurality of electrode pads (not shown) constituting input and output parts of the light receiving device are provided at the outer circumferential region of the front of the semiconductor chip 3. Furthermore, a through hole 4 is formed immediately below each of the electrode pads of the semiconductor chip 3 such that the through hole 4 extends from the front to the back (the surface opposite to the surface facing the cover glass 1). A wire 5 is provided in the through hole 4 and the back of the semiconductor chip 3. A terminal 7 is formed at the end of the wire 5 on the back of the semiconductor chip 3. The terminal 7 and the corresponding electrode pad are electrically connected to each other via the wire 5 extending from the interior of the through hole 4 to the back of the semiconductor chip 3. An insulation film 6 is formed on the back of the semiconductor chip 3 excluding the terminals 7 such that the through holes 4 and the wires 5 are covered by the insulation film 6. The terminals 7 protrude more outward than the insulation film 6.

Also, a colored light shielding layer 8 is formed to cover an outer circumferential region of the front of the cover glass 1 and the entirety of a side of the cover glass 1. The tip end of the light shielding layer 8 extends to the side of the semiconductor chip 3. As shown in FIG. 1B, the light shielding layer 8 is formed at the top of the semiconductor module in a ring shape. The center of the front of the cover glass 1 is exposed through an opening 8a of the light shielding layer 8. The light shielding layer 8 is formed of an insulation material, such as acryl, silicone, polyimide, epoxy, etc. The light shielding layer 8 has light blocking effect and is colored, for example, black or dark grey. The opening 8a is larger than the light receiving device region on the front of the semiconductor chip 3.

The distance between a portion of the top of the semiconductor module, i.e., the front of the light shielding layer 8, and the front of the semiconductor chip 3 is set to be within a predetermined tolerance. The tolerance is, for example, ±5 micrometers. This is achieved by mechanically polishing the front of the light shielding layer 8 in a polishing and cutting process, which will be described later.

A lens unit 12 having a lens 12a is fixedly bonded to the front of the light shielding layer 8. The lens 12a, which is a condensing part, is supported by a support part 12b of the lens unit 12. The lens 12a condenses light on the light receiving device of the semiconductor chip 3 via the cover glass 1.

Although, in this embodiment, all four sides of the cover glass 1 are covered by the light shielding layer 8, at least two opposite sides of the cover glass 1 may be covered by the light shielding layer 8.

Since, in the semiconductor module with the above-stated construction, a portion (outer circumferential region) of the front of the cover glass 1, the side of the cover glass 1, the side of the encapsulation material 2, and a portion of the side of the semiconductor chip 3 are covered by the light shielding layer 8, light is prevented from being introduced from the side of the semiconductor module. Consequently, it is possible to prevent sensor performance from being deteriorated due to leakage of light from the side of the cover glass 1 to the sensor main body, i.e., the light receiving device, of the semiconductor chip 3. Also, since not only the side of the cover glass 1 but also the outer circumferential region of the front of the cover glass 1 is covered by the light shielding layer 8, it is possible to more effectively prevent the introduction of unnecessary light to the light receiving device.

Also, since the outer circumferential region of the cover glass 1 is protected by the light shielding layer 8, it is possible to prevent a portion of the cover glass 1 from being defective due to impact caused by handling during the manufacture of the semiconductor module.

Furthermore, since the distance between the front of the light shielding layer 8 and the light receiving device disposed at the front of the semiconductor chip 3 is set to be within a predetermined tolerance, it is possible to adjust the distance between the lens 12a and the front of the semiconductor chip 3 at high precision simply by fixing the lens unit 12 to the front of the light shielding layer 8, and therefore, troublesome distance adjustment (focusing) is not necessary. Consequently, it is possible to achieve easy manufacture of a camera module.

Next, a manufacturing method of the semiconductor module with the above-stated construction will be described with reference to FIGS. 2A to 2H. The semiconductor module is manufactured in the following process sequence of (1) to (8).

(1) First, as shown in FIG. 2A, a light permeable wafer 21, an encapsulation member 22, and a semiconductor device wafer 23 are positioned according to a predetermined positional relationship (a positioning process). To obtain a plurality of cover glasses 1, the prepared light permeable wafer 21 is made of a glass material having a thickness of each of the cover glasses 1. The encapsulation member 22 is configured by successively forming a plurality of encapsulation materials 2. The encapsulation member 22 has openings 22a, corresponding to openings 2a of the encapsulation materials 2, formed at predetermined intervals. Also, semiconductor device main bodies, i.e., light receiving devices, are provided in the prepared semiconductor device wafer 23 at predetermined intervals. Portions constituting semiconductor chips 3, i.e., semiconductor device forming regions including the light receiving devices, are successively formed while groove forming regions are interposed respectively between the semiconductor device forming regions. The groove forming regions are regions where grooves 26, which will be described later, are to be formed. The predetermined positional relationship is a relationship in which the semiconductor main bodies of the semiconductor device wafer 23 are positioned in the centers of the respective openings 22a of the encapsulation member 22, and the side of the light permeable wafer 21 and the side of the semiconductor device wafer 23 coincide with each other in the horizontal direction of FIG. 2A. Meanwhile, the light permeable wafer 21, the encapsulation member 22, and the semiconductor device wafer 23 have almost the same shape. General wafer shapes of Ø 8 inches or Ø 12 inches are used.

(2) Next, as shown in FIG. 2B, the light permeable wafer 21, the encapsulation member 22, and the semiconductor device wafer 23 are bonded to one another while the predetermined positional relationship among the light permeable wafer 21, the encapsulation member 22, and the semiconductor device wafer 23 is retained (a boding process). As a result, a semiconductor wafer is formed.

(3) Subsequently, as shown in FIG. 2C, the back of the semiconductor device wafer 23 is mechanically or chemically polished in order for the distance between the front of the light permeable wafer 21 and the back of the semiconductor device wafer 23 to have a predetermined value (a polishing process).

(4) As shown in FIG. 2D, through holes 24 are formed in the semiconductor device wafer 23 by dry etching or wet etching. The through holes 24 correspond to the previously described through holes 4. An insulation film (not shown) is formed on the inner walls of the through holes 24 and the back of the semiconductor device wafer 23. Wires 25 are formed in the through holes 24 and on the back of the semiconductor device wafer 23 by sputtering, plating and so on (a wire forming process).

(5) When the wire forming process is completed, as shown in FIG. 2E, grooves 26 are formed at predetermined positions such that the grooves 26 extend from the front of the light permeable wafer 21 to the interior of the semiconductor device wafer 23 (a groove forming process). The grooves 26 may be formed by dicing using a blade. This is because the dicing achieves cutting more easily than a laser, and, in addition, the dicing does not need a mask necessary for etching. The grooves 26 are formed at predetermined intervals in parallel. The grooves 26 deeply extend through the light permeable wafer 21 and the encapsulation member 22, and terminate in the semiconductor device wafer 23.

(6) Subsequently, as shown in FIG. 2F, light shielding layers 27 are formed in the grooves 26 of the light permeable wafer 21 and on opposite surrounding regions, adjacent to the grooves 26, of the front of the light permeable wafer 21 (a light shielding layer forming process). The light shielding layers 27 may be formed by vacuum printing while portions (corresponding to the opening 8a) where no light shielding layers are formed are masked. Since, in the vacuum printing, the light shielding layers 27 are formed using a mask, it is not necessary to remove a desired region after forming a colored layer, such as a spin coat. Consequently, it is possible to reduce the number of manufacturing processes.

(7) As shown in FIG. 2G, the fronts of the light shielding layers 27 are mechanically polished such that the distance between the fronts of the light shielding layers 27 and the front of the semiconductor device wafer 23 has a predetermined value. After that, the semiconductor wafer is cut such that the light shielding layers 27 in the grooves 26 are divided into cut parts 29 (a polishing and cutting process). The polishing may be performed using a grinder. The cutting may be performed by dicing using a blade.

(8) Lens units 30 are prepared, and, as shown in FIG. 2H, the lens units 30 are fixed to the fronts of the divided light shielding layers 27 (a lens fixing process). As a result, semiconductor modules identical to the semiconductor module shown in FIGS. 1A and 1B are obtained.

Although not shown in FIGS. 2A to 2H, portions corresponding to the terminals 7 and the insulation film 6 of FIG. 1A may be formed immediately after the wire forming process or after the cutting process. Also, the lens fixing process may be performed after the polishing process to polish the fronts of the light shielding layers 27 and before the cutting process.

Furthermore, although the openings 22a are previously formed in the encapsulation member 22 in the above description, the openings may be formed by hot lithography after an encapsulation material layer is formed on the light permeable wafer 21 or the semiconductor device wafer 23. Also, the encapsulation member 22 may be a liquefied or sheet-shaped encapsulation member.

According to the manufacturing method of the semiconductor module as described above, the grooves, extending from the front of the light permeable wafer to the interior of the semiconductor device wafer, are formed such that the semiconductor device wafer is divided into wafer portions corresponding to the respective semiconductor chips by the grooves in the groove forming process, and the colored light shielding layers are formed in the grooves and on opposite surrounding regions, adjacent to the grooves, of the front of the light permeable wafer in the light shielding layer forming process. Consequently, light is prevented from being introduced from the side of the light permeable cover, and therefore, it is possible to prevent sensor performance of the light receiving device of the semiconductor chip from being deteriorated due to unnecessary light. Also, since the outer circumferential region of the cover glass 1 is protected by the light shielding layer 8, it is possible to prevent a portion of the cover glass 1 from being defective due to impact caused by handling during the manufacture of the semiconductor module.

Furthermore, since the front of the light shielding layer on the region adjacent to the semiconductor device wafer is mechanically polished such that the distance between the front of the semiconductor device wafer and the front of the light shielding layer on the region adjacent to the semiconductor device wafer has a predetermined value in the polishing and cutting process, it is possible to set the distance between the front of the light shielding layer and the front of the semiconductor chip such that the distance is within a predetermined tolerance, and it is possible to appropriately adjust the distance between the lens and the front of the semiconductor chip for focusing simply by fixing the lens unit to the front of the light shielding layer.

Meanwhile, although the light permeable cover opposite to the semiconductor chip was described as being embodied by a glass cover in the above embodiment, the light permeable cover may be formed of a material, such as plastic, which is substantially transparent at a desired wavelength band. Also, various kinds of coatings may be applied to the front of the light permeable cover.

Also, although the space between the semiconductor chip and the cover glass was described as being empty in the above embodiment, the space between the semiconductor device and the cover glass may be filled with an encapsulation material.

Furthermore, although the light shielding layer was described as being formed of a resin easily applicable to the semiconductor process, for example an insulation material, such as acryl, silicone, polyimide, epoxy, etc., the light shielding layer may be formed of other different insulation materials.

Also, although the cutting is performed by a dicing blade, laser dicing, or etching in the above-described cutting process, the present invention is not limited to these cutting methods.

Also, although the grooves 26 are filled with the light shielding layers 27 by vacuum printing, spin coating, or spraying in the light shielding layer forming process, the present invention is not limited to these cutting methods, and other different filling methods may be used.

Furthermore, although the semiconductor module includes a lens unit in the above embodiment, the present invention may be applied to a semiconductor module constructed such that the semiconductor module does not include a lens unit but a lens unit can be mounted in the semiconductor module.

This application is based on Japanese Application No. 2008-286500, which is incorporated herein by reference.

What is claimed is:

1. A semiconductor module comprising:
a semiconductor chip having a light receiving device formed at a front thereof;
a light permeable cover having
 a front,
 a back,
 a side, and
 an outer circumferential region at the front of the light permeable cover,
the light permeable cover being disposed opposite to the front of the semiconductor chip such that the front of the semiconductor chip is covered by the back of the light permeable cover;
a light shielding layer, formed of an insulation material, for blocking light from reaching the light receiving device, the light shielding layer having
 a first portion formed at the outer circumferential region, and
 a second portion formed on the side of the light permeable cover, a tip end of the second portion extending to a side of the semiconductor chip;
a lens unit having
 a condensing part for condensing light onto the light receiving device via the light permeable cover, and
 a support part, fixed on the first portion of the light shielding layer at the outer circumferential region, for supporting the condensing part; and
an adhesion layer on the semiconductor chip and having an opening formed at a central portion thereof,
wherein the adhesion layer, the light permeable cover, the first portion and the support part are stacked in that stated order on the semiconductor chip,
wherein the light shielding layer includes only the first and second portions so that the outer circumferential region at the front of the light permeable cover, the side of the light permeable cover, a side of the adhesion layer, and a portion of the side of the semiconductor chip are each directly covered by the light shielding layer such that no other part of the light permeable cover, the adhesion layer and the semiconductor chip is directly covered by the light shielding layer.

2. The semiconductor module according to claim 1, further comprising:
- an electrode pad, disposed at an outer circumference of the front of the semiconductor chip, electrically connected to the light receiving device;
- a through hole formed at a position corresponding to the electrode pad and provided at the outer circumference of the semiconductor chip such that the through hole extends from the front to a back of the semiconductor chip;
- a wire disposed in the through hole; and
- an external terminal, disposed at the back of the semiconductor chip, electrically connected to the electrode pad via the wire.

3. The semiconductor module according to claim 1, wherein the side of the light permeable cover is entirely covered by the light shielding layer.

4. The semiconductor module according to claim 1, wherein the light shielding layer is formed of any one of epoxy, acryl, silicone, and polyimide.

5. The semiconductor module according to claim 1, wherein a thickness of the first portion of the light shielding layer is adjusted such that a distance between the front of the semiconductor chip and a front of the first portion of the light shielding layer has a predetermined value.

6. The semiconductor module according to claim 1, wherein the light shielding layer is disposed between the lens unit and the light permeable cover.

7. The semiconductor module according to claim 6, wherein the front of the light permeable cover faces the light shielding layer, and the light shielding layer is disposed along a line perpendicular to a surface of the front of the light permeable cover.

8. The semiconductor module according to claim 7, wherein a first surface of the light shielding layer touches the light permeable cover, and a second surface of the light shielding layer opposite the first surface touches the support part.

9. The semiconductor module according to claim 1, wherein the light shielding layer is black or grey.

10. The semiconductor module according to claim 1, wherein a first surface of the light shielding layer touches the light permeable cover, and a second surface of the light shielding layer opposite the first surface touches the support part.

11. The semiconductor module according to claim 10, wherein the lens unit is disposed so as to not touch the light permeable cover.

12. The semiconductor module according to claim 11, wherein the support part has a larger size than a size of an end portion of the condensing part that connects to the support part.

13. The semiconductor module according to claim 12, wherein the support part has a rectangular shape.

14. The semiconductor module according to claim 1, wherein the first portion is only formed on the outer circumferential region.

15. The semiconductor module according to claim 1, wherein the tip end of the second portion touches the semiconductor chip.

16. The semiconductor module according to claim 1, wherein
- the adhesion layer touches both the semiconductor chip and the light permeable cover,
- the light permeable cover touches the first portion, and
- the first portion support touches the support part.

17. The semiconductor module according to claim 1, wherein
- the light shielding layer directly contacts a bottom surface of the support part so as to be free of any direct contact with side and top surfaces of the support part.

18. The semiconductor module according to claim 1, wherein the light shielding layer includes only the first and second portions so that the outer circumferential region, the side of the light permeable cover, the side of the adhesion layer, and the portion of the side of the semiconductor chip are each directly contacted by the light shielding layer such that all of the front of the semiconductor chip and the back of the light permeable cover are free of any direct contact with the light shielding layer.

* * * * *